United States Patent
Vercesi et al.

(10) Patent No.: US 11,855,604 B2
(45) Date of Patent: Dec. 26, 2023

(54) PIEZOELECTRIC MICROELECTROMECHANICAL RESONATOR DEVICE AND CORRESPONDING MANUFACTURING PROCESS

(71) Applicant: STMICROELECTRONICS S.r.l., Agrate Brianza (IT)

(72) Inventors: Federico Vercesi, Milan (IT); Lorenzo Corso, Ruginello (IT); Giorgio Allegato, Monza (IT); Gabriele Gattere, Castronno (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 514 days.

(21) Appl. No.: 17/031,181

(22) Filed: Sep. 24, 2020

(65) Prior Publication Data

US 2021/0099154 A1    Apr. 1, 2021

(30) Foreign Application Priority Data

Sep. 30, 2019 (IT) .................. 102019000017552

(51) Int. Cl.
*H03H 9/10* (2006.01)
*B81B 7/00* (2006.01)
(Continued)

(52) U.S. Cl.
CPC ......... *H03H 9/1021* (2013.01); *B81B 7/0038* (2013.01); *B81C 1/00285* (2013.01);
(Continued)

(58) Field of Classification Search
CPC .............................. H03H 9/1021; H03H 9/17
See application file for complete search history.

(56) References Cited

U.S. PATENT DOCUMENTS

| 2007/0024158 A1 | 2/2007 | Bourgeois |
| 2015/0115378 A1* | 4/2015 | Allegato ............. B81C 1/00238 438/51 |

(Continued)

FOREIGN PATENT DOCUMENTS

CN    110113006 A    8/2019

OTHER PUBLICATIONS

Hsu, "Recent Progress in Silicon Mems Oscillators", *40th Annual Precise Time and Time Interval (PTTI) Meeting*, 2008, pp. 135-146.

(Continued)

*Primary Examiner* — Bryan P Gordon
(74) *Attorney, Agent, or Firm* — Seed IP Law Group LLP (57) ABSTRACT

A microelectromechanical resonator device has: a main body, with a first surface and a second surface, opposite to one another along a vertical axis, and made of a first layer and a second layer, arranged on the first layer; a cap, having a respective first surface and a respective second surface, opposite to one another along the vertical axis, and coupled to the main body by bonding elements; and a piezoelectric resonator structure formed by: a mobile element, constituted by a resonator portion of the first layer, suspended in cantilever fashion with respect to an internal cavity provided in the second layer and moreover, on the opposite side, with respect to a housing cavity provided in the cap; a region of piezoelectric material, arranged on the mobile element on the first surface of the main body; and a top electrode, arranged on the region of piezoelectric material, the mobile element constituting a bottom electrode of the piezoelectric resonator structure.

19 Claims, 4 Drawing Sheets

(51) Int. Cl.
  *B81C 1/00*   (2006.01)
  *H03H 3/02*   (2006.01)
  *H03H 9/17*   (2006.01)
  *H03H 9/15*   (2006.01)

(52) U.S. Cl.
  CPC ............ *H03H 3/02* (2013.01); *H03H 9/17* (2013.01); *B81B 2201/0271* (2013.01); *B81B 2203/0118* (2013.01); *B81B 2203/0315* (2013.01); *B81B 2203/04* (2013.01); *B81B 2207/07* (2013.01); *B81C 2201/0105* (2013.01); *B81C 2203/0118* (2013.01); *H03H 2003/022* (2013.01); *H03H 2003/027* (2013.01); *H03H 2009/155* (2013.01)

(56) References Cited

U.S. PATENT DOCUMENTS

| | | | |
|---|---|---|---|
| 2016/0315244 A1* | 10/2016 | Khurshidjon | H03H 3/02 |
| 2017/0081174 A1* | 3/2017 | Liu | H10N 50/80 |
| 2017/0227497 A1* | 8/2017 | Rivas | H10N 30/1051 |
| 2018/0048285 A1 | 2/2018 | Nishimura et al. | |
| 2018/0107854 A1* | 4/2018 | Tsai | B81C 1/00301 |
| 2018/0234075 A1* | 8/2018 | Lee | H03H 9/13 |

OTHER PUBLICATIONS

Jaakkola, *Piezoelectrically transduced temperature compensated silicon resonators for timing and frequency reference applications*, Department of Applied Physics, Aalto University, Doctoral Dissertations, 2016, 100 pages.

\* cited by examiner

PIEZOELECTRIC MICROELECTROMECHANICAL RESONATOR DEVICE AND CORRESPONDING MANUFACTURING PROCESS

BACKGROUND

Technical Field

The present solution relates to a MEMS (Micro-Electro-Mechanical System) resonator device of a piezoelectric type and to a corresponding manufacturing process.

Description of the Related Art

As it is known, resonator devices are commonly used with clock function within electronic apparatuses, whether portable or fixed, such as mobile phones, video or photographic cameras, automotive apparatuses, electrical household appliances, data-collection terminals, smart-card readers, etc., in order to count the passage of real time (in terms of years, months, days, hours, minutes, and seconds), even when the corresponding electronic apparatuses are switched off.

A resonator device for RTC applications generally comprises: an oscillator provided with an appropriate resonant structure, also referred to simply as "resonator", configured to generate an operating (or resonance) frequency, for example equal to, or a multiple of, 32.768 kHz; a processing circuit, coupled to the oscillator, for supplying suitable biasing signals and counting the passage of time on the basis of the aforesaid operating frequency; and an appropriate electric power source for supplying electric power to the device.

Even though quartz technology has for decades dominated the field of frequency generation (also for the aforesaid real-time clock applications), MEMS resonator devices based on semiconductor technology, in particular silicon semiconductor technology, have in recent times been proposed with ever-increasing success.

The advantages linked to the use of MEMS resonator devices are represented above all by a marked containment of the dimensions and by the reduction in costs, thanks to the possibility of using standard semiconductor manufacturing processes and of integrating at low cost in a same package both the resonant mechanical structure and the corresponding electronic circuit (in the form of an ASIC—Application-Specific Integrated Circuit).

Moreover, MEMS resonator devices are generally more resistant to impact and to mechanical stresses and have electrical consumption levels lower than those of traditional quartz solutions (the reduction of consumption levels being a particularly important characteristic, especially for applications of a portable type).

MEMS resonator devices include structures obtained using micromachining techniques, which, as a result of appropriate stimuli (via electrical biasing signals), are induced to vibrate at their natural resonance frequency. These micromechanical structures typically comprise at least one mobile element, which is set in resonance by the applied biasing signals.

In particular, MEMS resonator devices of a capacitive type are known, in which the mobile element forms, with a fixed electrode structure coupled thereto, a capacitor, and in which resonance vibration of the mobile element causes a variation of capacitance of this capacitor, which is converted into an output signal at the desired operating frequency.

However, known solutions envisage costly and complex manufacturing processes, for example, requiring the use, as starting structure, of a SOI (Silicon-On-Insulator) substrate of a C-SOI (Cavity-bonded SOI) type, inside which, that is, a pre-formed buried cavity is provided.

Moreover, known solutions do not envisage integration, at the level of the microelectromechanical structure, of a package for covering and protecting the resonant element, therefore requiring external caps, for example, of metal or ceramic material; the overall dimensions of the resonator device are therefore large, and performance, for example, in terms of parasitic capacitance, is not optimal.

BRIEF SUMMARY

The present disclosure provides an improved solution for a piezoelectric MEMS resonator device, which enables one or more of the disadvantages associated to known solutions to be overcome.

According to the present solution, a piezoelectric MEMS resonator device and a corresponding manufacturing process are therefore provided. The MEMS resonator device may, for example, be advantageously used for real-time clock (RTC) applications, to which the following discussion will make particular reference, without this implying any loss of generality

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figures 1, 2A, 3:
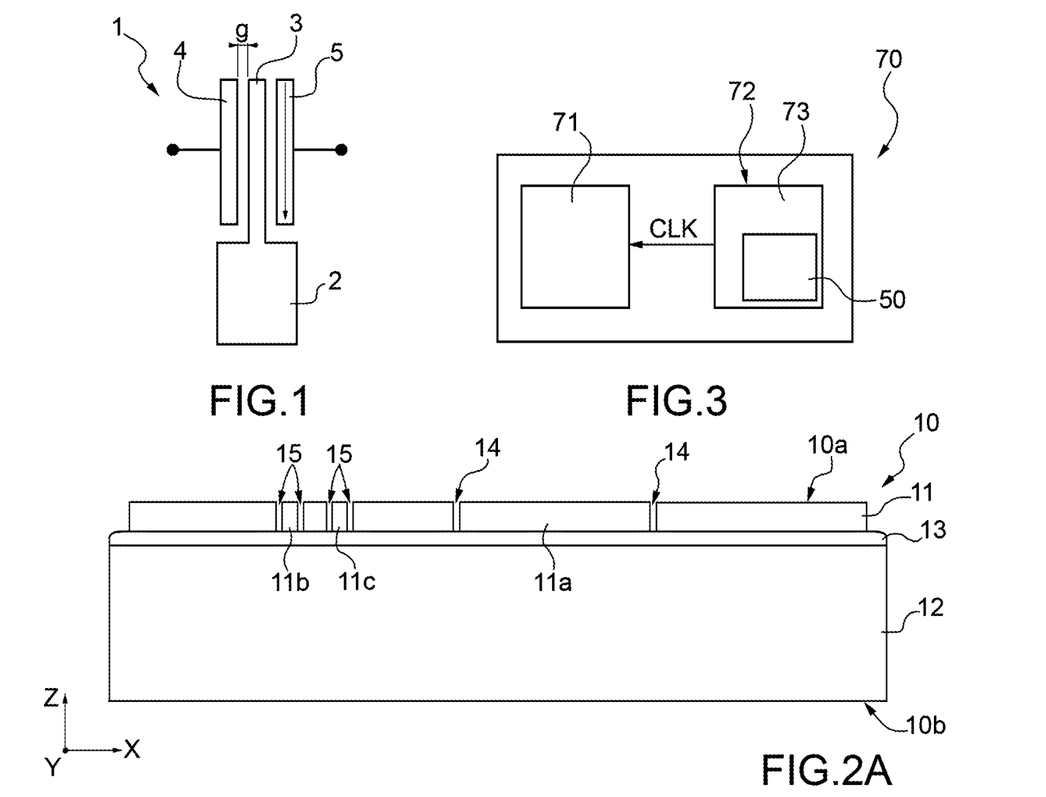
FIG. 1 shows a schematic representation of a model of a capacitive-type MEMS resonator.
FIGS. 2A-2I are cross-sectional views of a piezoelectric MEMS resonator device, in successive steps of a manufacturing process according to one embodiment of the present disclosure.
FIG. 3 is a general block diagram of an electronic device that incorporates the microelectromechanical resonator device, according to a further aspect of the present disclosure.

FIG. 1 is a schematic illustration of the model of the structure of a capacitive-type MEMS resonator, designated by 1.

The MEMS resonator 1 comprises a mass 2, coupled to which is an arm (or beam) 3, with main longitudinal extension, which extends in cantilever fashion in a suspended way from the same mass 2.

The MEMS resonator 1 further comprises a first electrode and a second electrode 4, 5, arranged facing and parallel to the arm 3, on opposite sides thereof.

During operation, application of an appropriate biasing voltage between the first electrode 4 (acting as driving electrode) and the arm 3 causes a resonance movement of the same arm 3 at the mechanical resonance frequency.

The consequent approach to, or moving away from, the second electrode 5 (acting as sensing electrode) causes a variation of the capacitive coupling, which enables generation of an associated electrical signal, also at the resonance frequency, by an electronic circuit associated to the MEMS resonator 1 (not illustrated herein).

The present Applicant has found that the MEMS resonator 1 of a capacitive type described previously is affected by some problems that do not enable full exploitation of the advantages thereof.

In some embodiments, the distance (or gap, designated by g in FIG. 1) between the electrodes 4, 5 and the arm 3 proves critical for the electrical performance of the device; in fact, a very small gap, for example, of the order of some hundreds of nanometers, is desired to have a low power dissipation. Consequently, the manufacturing process used should enable an accurate control of the dimensions, in some embodiments of the aforesaid gap.

Moreover, the device 1 uses an actuation of a non-linear type and, consequently, a dedicated electronic circuit, and is therefore not able to constitute a direct replacement of traditional quartz resonators, which operate on the basis of the piezoelectric effect.

MEMS resonator devices of a piezoelectric type, e.g., operating on the basis of the piezoelectric effect, can overcome some of the aforesaid problems. In such solutions, a mobile element is driven in resonance by application of an appropriate electrical biasing to a region of piezoelectric material coupled to the same mobile element. The piezoelectric solutions may be advantageous as compared to capacitive solutions, given that, being based upon the piezoelectric effect, like traditional quartz solutions, they can be associated to pre-existent electronic circuits (therefore enabling direct replacement of traditional quartz resonators).

With reference to FIG. 2A, an embodiment of a process for manufacturing a piezoelectric MEMS resonator device is now described according to one aspect of the present disclosure.

The manufacturing process envisages providing a SOI wafer 10, having a front surface 10a and a rear surface 10b, which extend in a horizontal plane xy defined by a first horizontal axis x and a second horizontal axis y and are opposite to one another along a vertical axis z, and comprising: a structural substrate 11, defining the aforesaid front surface 10a and made of monocrystalline silicon doped so as to be electrically conductive. As will be described herein in detail, in this structural substrate 11, the bottom electrode of a piezoelectric resonator structure will be provided; a supporting substrate 12, defining the aforesaid rear surface 10b; and a dielectric layer 13, for example, of silicon oxide, interposed between the aforesaid structural substrate 11 and supporting substrate 12.

As shown in the aforesaid FIG. 2A, the structural substrate 11 is initially subjected to chemical etching from the front surface 10a (using an appropriate photolithographic mask, not illustrated herein) so as to dig trenches that extend through the entire thickness of the same structural layer 11, until the dielectric layer 13 is reached, and in some embodiments: definition trenches 14, configured to define the arrangement, geometry, and dimensions of a resonator portion 11a of the aforesaid structural substrate 11, which, as will be highlighted herein, will constitute the mobile element of the piezoelectric resonator structure; and moreover insulation trenches 15, arranged laterally at a distance from the definition trenches 14, e.g., along the first horizontal axis x, and configured to define, between them, a first bottom interconnection portion 11b and a second bottom interconnection portion 11c, insulated from one another, of the same structural layer 11, which, as will be highlighted hereinafter, will contribute to define electrical interconnection elements towards bottom and top electrodes of the piezoelectric resonator structure.

Figure 2B:
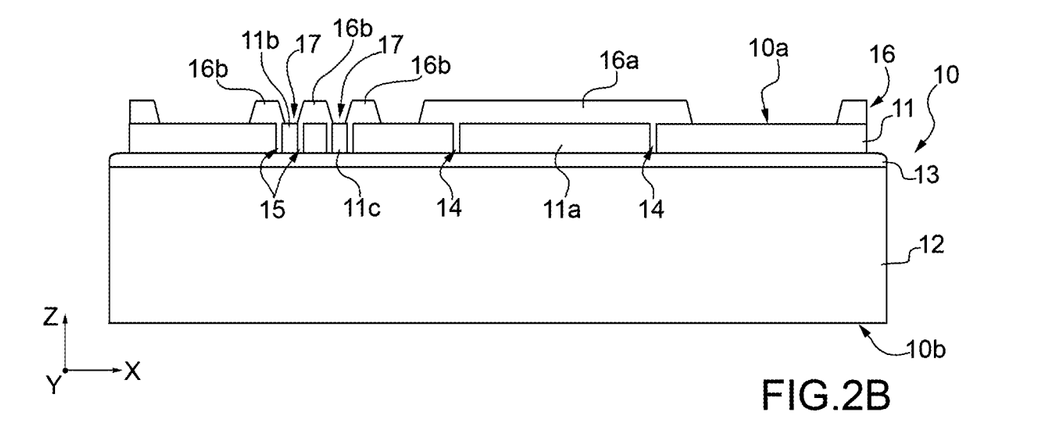

As illustrated in FIG. 2B, the SOI wafer 10 is then subjected to a process of thermal oxidation from the front surface 10a, which leads to formation of a surface dielectric layer 16, in some embodiments of silicon oxide, which extends above the same front surface 10a and moreover within the trenches defined previously through the structural substrate 11, filling the aforesaid definition trenches 14 and insulation trenches 15 (and thus providing electrical insulation between the aforesaid first and second bottom interconnection portions 11b, 11c of the structural substrate 11).

The surface dielectric layer 16 is then subjected to chemical etching (using an appropriate photolithographic mask, not illustrated herein) so as to define: a sacrificial portion 16a, set in an area located above the resonator portion 11a of the structural substrate 11 (and having a side extension, in the horizontal plane xy, greater than that of the resonator portion 11a); and insulation portions 16b, which are arranged laterally with respect to the sacrificial portion 16a (along the aforesaid first horizontal axis x) and define between them openings 17, in a position vertically corresponding to the aforesaid first and second bottom interconnection portions 11b, 11c of the structural substrate 11.

Figure 2C:
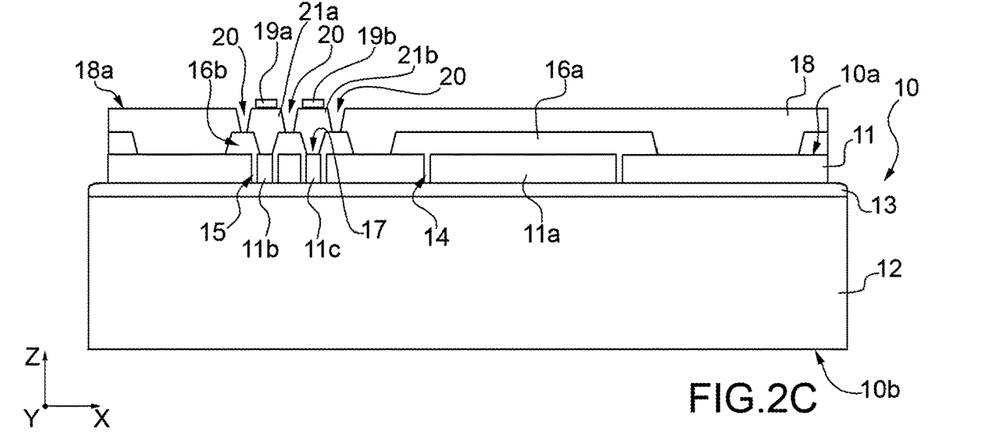

As illustrated in FIG. 2C, a process of epitaxial growth is then carried out from the front surface 10a, with subsequent planarization that leads to formation of an epitaxial silicon layer 18, which is arranged above the front surface 10a and provides a coating for the aforesaid surface dielectric layer 16, in some embodiments, the epitaxial silicon layer 18 moreover filling the aforesaid openings 17.

As illustrated in the same FIG. 2C, a first contact pad 19a and a second contact pad 19b are then formed on the epitaxial silicon layer 18, in a position vertically corresponding to the first and second bottom interconnection portions 11b, 11c, respectively, of the structural substrate 11. As will be highlighted hereinafter, the first and second contact pads 19a, 19b are configured to enable electrical contact towards the top electrode and bottom electrode, respectively, of the piezoelectric resonator structure. The aforesaid first and second contact pads 19a, 19b may be formed by deposition and etching of a layer of conductive material, for example, a metal material.

The epitaxial silicon layer 18 is then subjected to etching from a corresponding top surface 18a, which is not in contact with the structural substrate 11, to form, laterally with respect to the aforesaid first and second contact pads 19a, 19b, insulation openings 20, which define between them a first top interconnection portion 21a and a second top interconnection portion 21b of the epitaxial silicon layer 18 that constitute a prolongation along the vertical axis z of the first bottom interconnection portion 11b and of the second bottom interconnection portion 11c, respectively, of the structural substrate 11. The first top interconnection portion 21a and a second top interconnection portion 21b are to form, jointly therewith, interconnection elements of the piezoelectric resonator structure. The aforesaid insulation openings 20 thus provide electrical insulation between the aforesaid first and second top interconnection portions 21a, 21b of the epitaxial silicon layer 18.

Figure 2D:
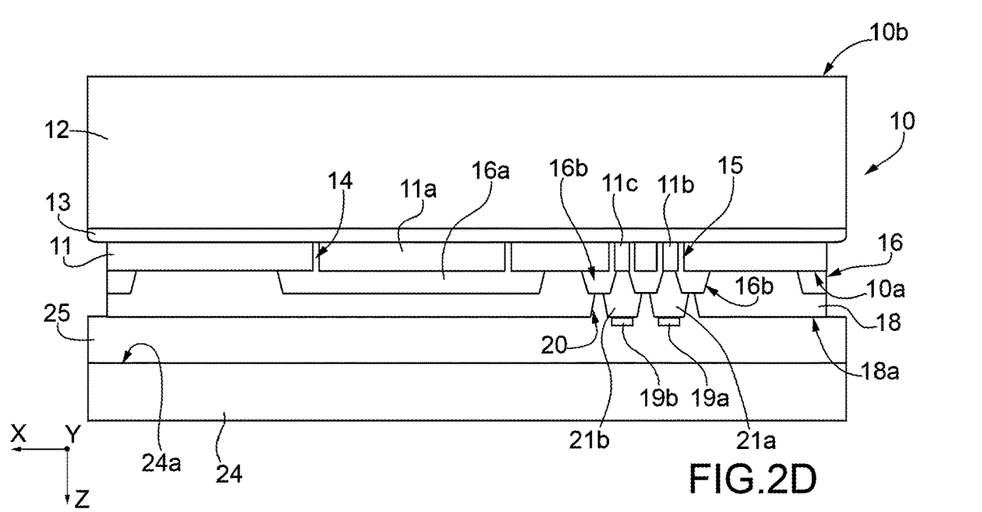

As illustrated in FIG. 2D, the SOI wafer 10 is then coupled, via temporary or permanent bonding, to a so-called handling wafer 24, for example, also made of semiconductor material, such as silicon. In some embodiments, an adhesion layer 25, of an appropriate dielectric, e.g., electrically non-conductive, bonding material, for example, a vitreous bonding material, such as glass-frit, is interposed between the front surface of the SOI wafer 10, now defined by the top surface 18a of the aforesaid epitaxial silicon layer 18, and a facing bonding surface 24a of the handling wafer 24. This adhesion layer 25 moreover fills, in the example, the aforesaid insulation openings 20 and coats the aforesaid first and second contact pads 19a, 19b. It should be noted that, alternatively or additionally, the adhesion layer 25 may be formed, for example, using techniques such as screen printing, in a localized manner only in some areas of the top surface 18a; in this case, the insulation openings 20 may not be filled by the same adhesion layer 25.

As illustrated in the same FIG. 2D, the stack formed by the SOI wafer 10 and the handling wafer 25 is then flipped over, e.g., with so-called flip-chip operation, so that the rear surface 10b of the SOI wafer 10, defined by the corresponding supporting substrate 12, faces upwards and is therefore available for subsequent manufacturing steps.

Figure 2E:
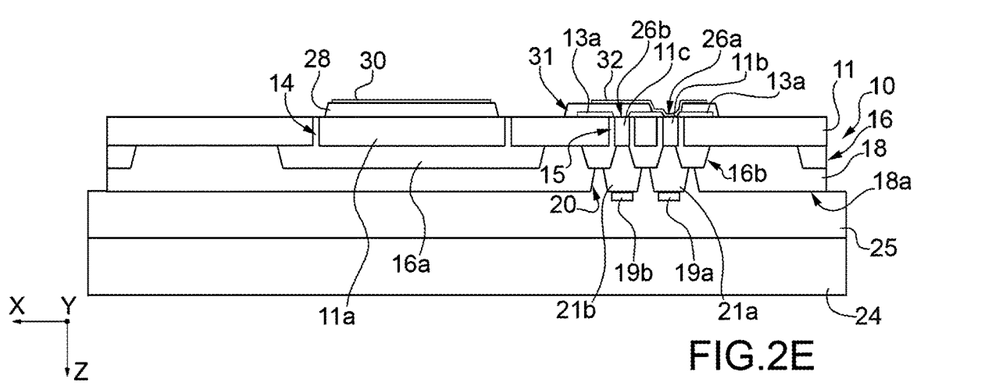

As illustrated in FIG. 2E, the supporting substrate 12 of the SOI wafer 10 is then totally removed, by removal of surface material, e.g., through a so-called grinding operation. A major part of the dielectric layer 13 of the same SOI wafer 10 is moreover removed except for residual portions 13a thereof, arranged vertically with respect to the first and second contact pads 19a, 19b and at a laterally offset position with respect to the first and second contact pads 19a, 19b. In other words, the residual portions 13a of the dielectric layer 13 define between them a first opening 26a and a second opening 26b in positions vertically corresponding to the aforesaid contact pads 19a, 19b, the first and second bottom interconnection portions 11b, 11c of the structural substrate 11, and the first and second top interconnection portions 21a, 21b of the epitaxial silicon layer 18.

As illustrated in the same FIG. 2E, a layer of piezoelectric material, for example, aluminum nitride (AlN), is then deposited above the surface of the structural substrate 11 (opposite to the epitaxial silicon layer 18 along the vertical axis z), now exposed and accessible; this layer of piezoelectric material is appropriately defined via photolithographic etching so as to form a region of piezoelectric material 28 directly above the resonator portion 11a of the structural substrate 11.

On the aforesaid region of piezoelectric material 28 a layer of conductive material, in some embodiments a metal material, for example, molybdenum, is then deposited and defined so as to form a top electrode region 30 of what will be the piezoelectric resonator structure.

In the embodiment illustrated, definition of the aforesaid layer of piezoelectric material moreover leads to formation of a further piezoelectric region 31, arranged laterally with respect to the aforesaid region of piezoelectric material 28, above the residual portions 13a of the dielectric layer 13. In some embodiments, this further piezoelectric region 31 fills the second opening 26b arranged in a position vertically corresponding to the second contact pad 19b, whereas it leaves the first opening 26a arranged in a position vertically corresponding to the first contact pad 19a exposed and accessible.

Moreover, definition of the aforesaid layer of conductive material also leads to formation of a conductive path 32, which extends on the aforesaid further piezoelectric region 31 and in some embodiments into the aforesaid first opening 26a so as to come directly into contact with the underlying interconnection element of what will be the piezoelectric resonator structure (formed jointly by the first bottom interconnection portion 11b of the structural substrate 11 and the first top interconnection portion 21a of the epitaxial silicon layer 18), in electrical contact with the aforesaid first contact pad 19a.

In a way not illustrated in the cross-sectional view of FIG. 2E, the conductive path 32 is moreover set electrically in contact with the top electrode region 30.

Figure 2F:
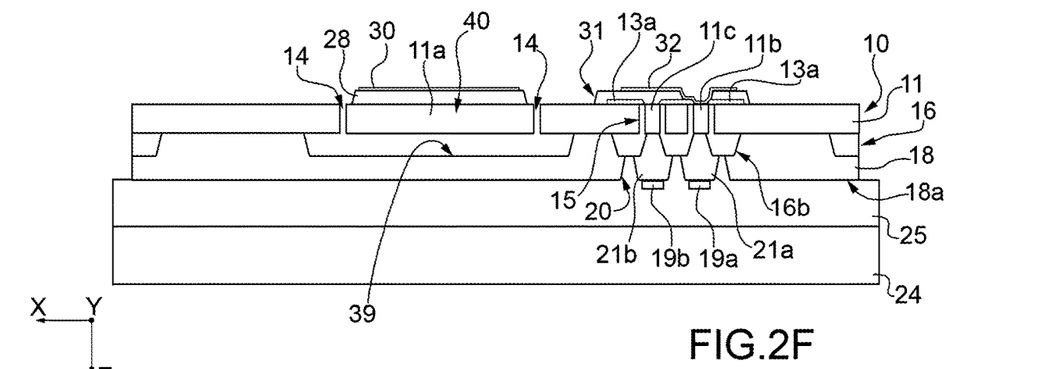

As illustrated in FIG. 2F, the wafer 10 is then subjected to etching, for example, wet etching, or vapor etching with hydrofluoric acid, HF, for complete removal of the dielectric material contained in the definition trenches 14 and of the sacrificial portion 16a of the surface dielectric layer 16, which leads to formation of an internal cavity 39 in the epitaxial layer 18, so as to obtain release of the resonator portion 11a of the aforesaid structural substrate 11, which therefore forms a mobile element, here designated by 40, of the piezoelectric resonator structure.

It is noted that the aforesaid etching process does not, instead, lead to removal of the remaining dielectric regions, which are not in fact accessible from the top surface being processed, e.g., the surface of the structural substrate 11 opposite to the epitaxial silicon layer 18.

Figure 2G:
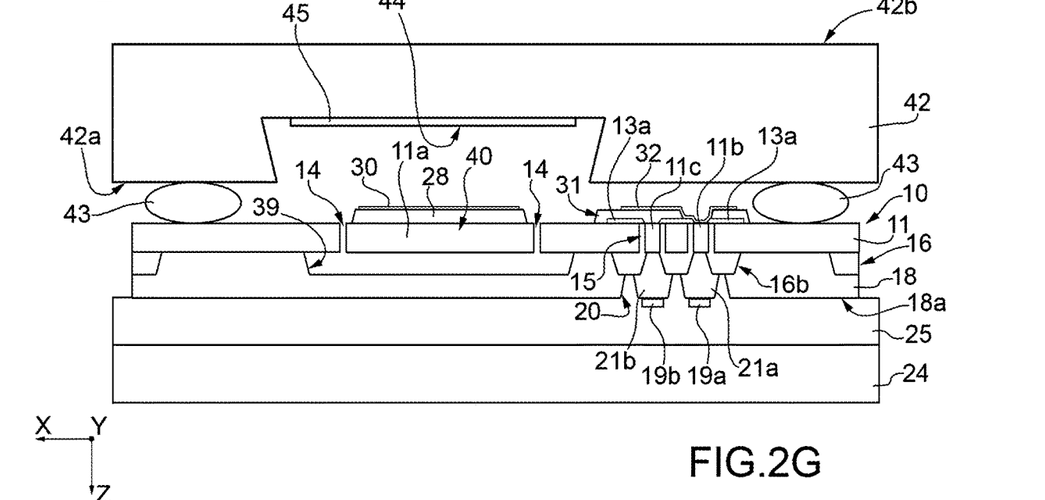

As illustrated in FIG. 2G, a cap wafer 42, for example, of semiconductor material, in some embodiments silicon, is then coupled to the SOI wafer 10, on the supporting layer 11 (on the side opposite to the aforesaid epitaxial silicon layer 18), by interposition of bonding elements 43 of appropriate material, in some embodiments dielectric, for example, vitreous, material, such as glass-frit. These bonding elements 43 are arranged laterally with respect to the structures described previously, in some embodiments, with respect to the mobile element 40 and to the further piezoelectric region 31, and define a separation distance between the SOI wafer 10 and the cap wafer 42.

The cap wafer 42 itself has, in a position vertically corresponding to the mobile element 40, a housing cavity 44.

In some embodiments, an appropriate level of vacuum may be defined within the aforesaid housing cavity 44, by formation, for example, by deposition, of a getter region 45 within the housing cavity 44, for example, on a corresponding wall facing the mobile element 40.

The top surface of the cap wafer 42, opposite to the surface 42a facing the SOI wafer 10, designated by 42b, may be subjected to thinning by removal of material and/or chemical etching so as to obtain a resulting desired thickness, e.g., along the vertical axis z.

Figure 2H:
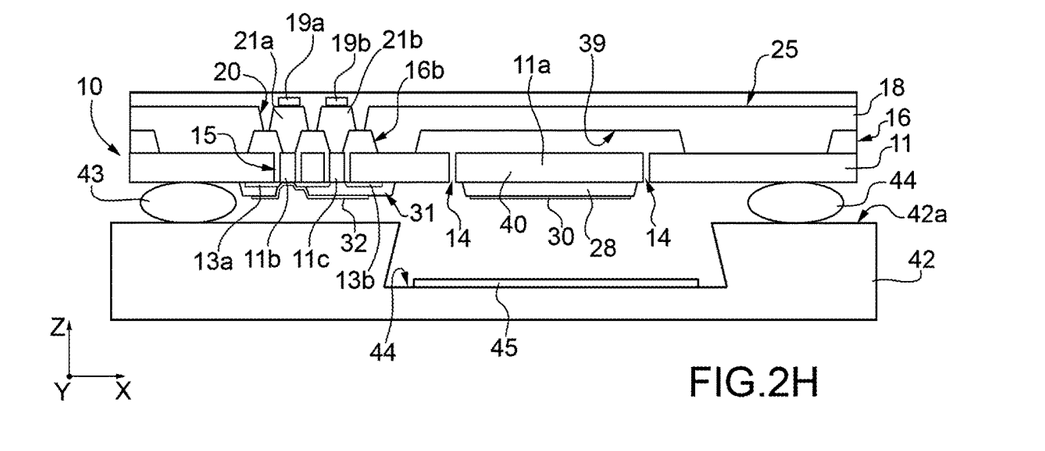

As illustrated in FIG. 2H, the stack formed by the SOI wafer 10, the handling wafer 25, and the cap wafer 42 is then flipped over, e.g., in a flip-chip operation, so that the handling wafer 24 faces upwards and is available for subsequent manufacturing steps.

The aforesaid subsequent manufacturing steps envisage, in some embodiments, total removal of the handling wafer 24 and moreover total or partial removal of the adhesion layer 25; for instance, as in the example illustrated in the aforesaid FIG. 2H, a portion of the adhesion layer 25 may remain, with functions of protection and coating, within the insulation openings 20 and/or above part of the outer surface of the epitaxial silicon layer 18 (without covering, however, the contact pads 19a, 19b).

Figure 2I:
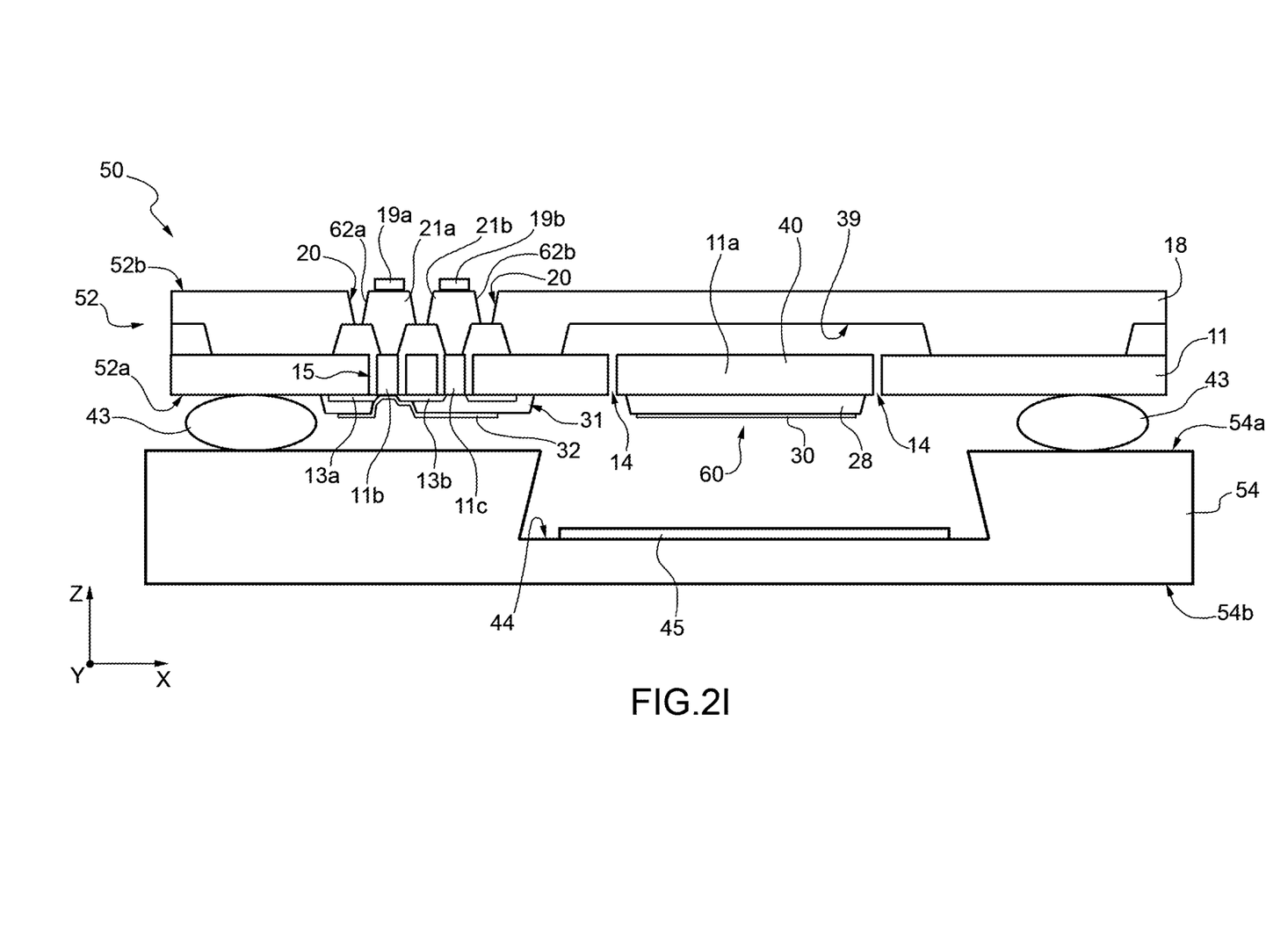

The manufacturing process then terminates with dicing of the SOI wafer 10 (and of the cap wafer 42), for definition of the resulting resonator device, which is illustrated in FIG. 2I, where it is designated as a whole by 50 (it is noted that in FIG. 2I it is assumed that the aforesaid adhesion layer 25 has been removed completely in the previous manufacturing steps).

The resonator device 50 therefore comprises a main body 52 (resulting from dicing of the aforesaid SOI wafer 10) having a first surface 52a and a second surface 52b, opposite to one another along the vertical axis z, and constituted by: the structural substrate 11, of doped monocrystalline silicon, which defines the aforesaid first surface 52a; and the epitaxial silicon layer 18, grown on the structural substrate 11, which defines the second surface 52b of the aforesaid main body 52.

The resonator device 50 further comprises a cap 54, resulting from dicing of the aforesaid cap wafer 42, having a respective first surface 54a and a respective second surface 54b, opposite to one another along the vertical axis z and bonded to the first surface 52a of the main body 52 through the bonding elements 43.

The resonator device 50 therefore has a package of the so-called wafer-level type, where the aforesaid second surface 52b of the main body 52 and the aforesaid second surface 54b of the cap 54 constitute outer surfaces in contact with an external environment (in a way not illustrated, a coating layer, for example, of epoxy resin, may be formed on the second surface 52b of the main body 52; alternatively, on the same second surface 52b part of the adhesion layer 25 may be present, in the case where it has been removed only in part during the manufacturing process).

In some embodiments, the resonator device 50 defines internally and integrally a piezoelectric resonator structure 60, comprising: the mobile element 40, formed by the resonator portion 11a of the structural substrate 11, appropriately coupled (in a manner not illustrated herein) to the aforesaid structural substrate 11 so as to be suspended in cantilever fashion, facing the internal cavity 39 formed in the epitaxial layer 18 and moreover, on the opposite side, the housing cavity 44, formed in the cap 54; and furthermore the region of piezoelectric material 28, arranged on the same mobile element 40 on the first surface 52a of the main body 52; and the top electrode 30, arranged on the region of piezoelectric material 28 (to form the so-called piezoelectric stack).

The piezoelectric resonator structure 60 further comprises the bottom electrode, of the same material as that of the mobile element 40 (monocrystalline silicon) and moreover a first interconnection element 62a and a second interconnection element 62b, which electrically connect the aforesaid top and bottom electrodes to the first and second contact pads 19a, 19b, which are arranged on the second surface 52b of the main body 52 (being in this way accessible from outside).

As mentioned previously, these interconnection elements 62a, 62b are electrically insulated from one another (due to the presence of the insulation trenches 15 filled with dielectric material and of the insulation openings 20, possibly filled with the material of the adhesion layer 25, in the case where it not has been removed completely or it has been formed in a localized manner and not within the insulation openings 20), and are formed by superimposition of the first and second top interconnection portions 21a, 21b, respectively, of the epitaxial silicon layer 18 and the first and second bottom interconnection portions 11b, 11c, respectively, of the structural substrate 11.

In some embodiments, the aforesaid first contact pad 19a enables electrical connection (for the purposes of biasing of the piezoelectric resonator structure 60 and of detection of an electrical signal at an appropriate oscillation frequency generated as a result of the corresponding movement at the resonance frequency) towards the top electrode 30, through the conductive path 32 formed on the first surface 52a of the main body 52; and the aforesaid second contact pad 19b enables electrical connection (once again for the purposes of biasing of the piezoelectric resonator structure 60 and of detection of the corresponding electrical signal at the oscillation frequency) to the bottom electrode (constituted, as has been mentioned, by the same mobile element 40).

The advantages of the present solution emerge clearly from the foregoing description.

In some embodiments, it is emphasized that the resonator device 50 has a low dependence on temperature of the corresponding oscillation frequency, thanks to the stability in temperature of the material used (doped monocrystalline silicon).

In addition, the resonator device 50 has small dimensions and in some embodiments a small thickness of the stack along the vertical axis z, thanks to the use of a wafer-level package and to the possibility of reduction of the thickness of the cap 54 (via the operation of thinning of the cap wafer 42, which exploits the temporary presence of the handling wafer 24).

Moreover advantageous, once again for the purposes of reduction of the dimensions, is the arrangement of the contact pads 19a, 19b on the outer surface of the epitaxial layer 18, which is grown directly on the structural substrate 11, with the interconnection elements 62a, 62b that connect the contact pads 19a, 19b to the top and bottom electrodes of the piezoelectric resonator structure 60, traversing the entire thickness of the same structural substrate 11 and the epitaxial silicon layer 18.

Bonding of the cap 54 to the main body 52, in some embodiments by glass-frit bonding, enables a hermetic packaging of the piezoelectric resonator structure 60 to be obtained (with the desired level of vacuum that can internally be obtained through the getter region 45).

Formation of the piezoelectric stack, obtained by stacking of the region of piezoelectric material 28 and of the top electrode region 30, advantageously enables adjustment and calibration of the electrical properties, for example, in terms of the frequency offset, of the piezoelectric resonator structure 60, via precise definition of the dimensions of the regions of material that are formed, the so-called trimming operations, which can involve, as an alternative or in addition, also the resonator portion 11a constituting the mobile element 40 of the piezoelectric resonator structure.

It is moreover underlined that, unlike known solutions that require complex and costly manufacturing steps, for example, starting from C-SOI substrates, the present disclosure allows to obtain the internal cavity 39, with respect to which the mobile element 40 is suspended in cantilever fashion, within a layer of epitaxial material, by etching of a sacrificial material on which the same epitaxial layer is previously grown, e.g., with standard semiconductor techniques, having low complexity and cost.

The resonator device 50 can advantageously replace traditional resonant quartz structures in pre-existing oscillator circuits, for example, for RTC applications, in some embodiments possibly constituting a direct replacement, e.g., using the same pins and contacts of pre-existing quartz resonators, exploiting in fact the same piezoelectric principle and therefore being altogether compatible with the associated electronic circuits.

In this regard, an electronic device 70 is illustrated schematically in FIG. 3, comprising: an application circuit 71, configured to perform one or more applications that require timing by a clock signal clk; and a clock circuit 72, configured to supply the clock signal clk to the application circuit 71.

The clock circuit 72 comprises the MEMS resonator device 50, described previously, and an associated electronic reading circuit 73.

Finally, it is clear that modifications and variations may be made to what has been described and illustrated herein, without thereby departing from the scope of the present disclosure.

In some embodiments, it is underlined that the geometry, dimensions, and coupling with respect to the structural substrate 11 of the mobile element 40 of the piezoelectric resonator structure 60 may vary with respect to what has been illustrated previously.

Moreover, it is underlined that the resonator device 50 can advantageously be used in a wide range of further applications, other than the real-time clock application to which particular reference has been made previously, for example, in reference high-frequency oscillators (which are, for example, used for supplying an appropriate frequency reference for operations of demodulation in electronic circuits).

The various embodiments described above can be combined to provide further embodiments. Aspects of the embodiments can be modified, if necessary to employ concepts of the various patents, applications and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro-electro-mechanical system resonator device, comprising:
a main body having a first layer with a first surface and a second layer with a second surface opposite to the first surface along an axis, the second layer having an internal cavity facing the first layer along the axis, the first layer including a mobile element overlapping the internal cavity and suspended in a cantilever fashion relative to the internal cavity;
a bonding element;
a cap having a first surface and a second surface opposite to one another along the axis, and the first surface of the cap bonded to the first surface of the main body by the bonding element, the cap including a housing cavity overlapping the internal cavity, the mobile element suspended in the cantilever fashion relative to the housing cavity; and
a piezoelectric resonator structure including:
the mobile element, configured as a bottom electrode;
a piezoelectric region of a piezoelectric material, arranged on the mobile element at the first surface of the main body; and
a top electrode arranged on the piezoelectric region.

2. The device according to claim 1, wherein the first layer is a structural substrate of doped monocrystalline silicon; and wherein the second layer is an epitaxial layer grown from the structural substrate.

3. The device according to claim 1, comprising:
a first contact element and a second contact element arranged on the second layer at the second surface of the main body; and
a first interconnection element and a second interconnection element that electrically couple the top and bottom electrodes of the piezoelectric resonator structure to the first and second contact elements, respectively, the first and second interconnection elements extending throughout a thickness of the main body along the axis.

4. The device according to claim 3, further comprising insulation regions extending through the main body along the axis, wherein the first and second interconnection elements each includes a stack of a first interconnection portion of the second layer and a second interconnection portion of the first layer; and the first and second interconnection elements are electrically insulated from one another by the insulation regions.

5. The device according to claim 4, wherein the insulation regions comprise:
insulation trenches in the first layer, the insulation trenches filled with a dielectric material, and
insulation openings in the second layer that overlap the dielectric material that fills in the insulation trenches along the axis.

6. The device according to claim 4, further comprising at least one path of conductive material arranged on the first surface of the main body and electrically coupling the first interconnection element to the top electrode of the piezoelectric resonator structure.

7. The device according to claim 1, wherein the bonding element is a dielectric material laterally separated from the mobile element, the first surface of the main body being spaced apart from the first surface of the cap by the bonding element.

8. The device according to claim 1, further comprising a getter region within the housing cavity, arranged on a wall of the housing cavity facing the mobile element.

9. The device according to claim 1, comprising a wafer-level package, wherein the second surface of the main body and the second surface of the cap constitute outer surfaces in contact with an external environment.

10. A structure, comprising:
a first body having a piezoelectric resonator structure suspended over a first cavity embedded in the first body along a first direction, the first cavity having a dimension in a second direction that contains a dimension of the piezoelectric resonator structure in the second direction, the second direction traverse to the first direction, the piezoelectric resonator structure including a first electrode, a second electrode and a piezoelectric layer positioned between the first electrode and the second electrode in the first direction;
a second body having a second cavity overlapping the piezoelectric resonator structure in the first direction, the second cavity having a dimension in the second direction that contains the dimension of the piezoelectric resonator structure in the second direction; and
a bonding layer between the first body and the second body in the first direction.

11. The structure of claim 10, wherein the piezoelectric layer protrudes toward the second cavity beyond a surface of the first body that faces the second body in the first direction.

12. A device, comprising:
a micro-electro-mechanical system resonator that includes:
a main body having a first layer with a first surface and a second layer with a second surface opposite to the first surface;
a cavity in the second layer;
a mobile element in the first layer, the mobile element suspended aligned with the cavity;

a cap having a first surface and a second surface opposite to the first surface, the first surface of the cap coupled to the first surface of the main body, the cap including:
  a housing cavity aligned with the internal cavity and the mobile element; and
a piezoelectric resonator structure including:
  a bottom electrode in the mobile element;
  a piezoelectric region of a piezoelectric material, on the mobile element at the first surface of the main body; and
  a top electrode on the piezoelectric region.

13. The device of claim 12 wherein the first layer is doped monocrystalline silicon and the second layer is an epitaxial layer.

14. The device of claim 12, comprising:
a first contact element and a second contact element on the second layer at the second surface of the main body; and
a first interconnection element and a second interconnection element that electrically couple the top and bottom electrodes of the piezoelectric resonator structure to the first and second contact elements, respectively.

15. The device of claim 14 wherein the first and second interconnection elements extend through the main body.

16. The device of claim 15, comprising insulation regions extending through the main body, the first and second interconnection elements each includes a stack of a first interconnection portion of the second layer and a second interconnection portion of the first layer.

17. The device of claim 16 wherein the first and second interconnection elements are electrically insulated from one another by the insulation regions.

18. The device of claim 17 wherein the insulation regions include:
insulation trenches in the first layer; and
insulation openings in the second layer that overlap the insulation trenches.

19. The device of claim 18, comprising a bonding element laterally separated from the mobile element, the first surface of the main body being spaced apart from the first surface of the cap by the bonding element.

* * * * *